US008957305B2

(12) United States Patent
Maruyama

(10) Patent No.: US 8,957,305 B2
(45) Date of Patent: Feb. 17, 2015

(54) ELECTROLYTE FOR PHOTOELECTRIC CONVERSION ELEMENT, AND PHOTOELECTRIC CONVERSION ELEMENT AND DYE-SENSITIZED SOLAR CELL USING SAME

(75) Inventor: Tsukasa Maruyama, Kanagawa (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 32 days.

(21) Appl. No.: 13/881,786

(22) PCT Filed: Oct. 28, 2011

(86) PCT No.: PCT/JP2011/074949
§ 371 (c)(1),
(2), (4) Date: Apr. 26, 2013

(87) PCT Pub. No.: WO2012/057325
PCT Pub. Date: May 3, 2012

(65) Prior Publication Data
US 2013/0206235 A1 Aug. 15, 2013

(30) Foreign Application Priority Data

Oct. 29, 2010 (JP) ................................ 2010-243683

(51) Int. Cl.
*H01L 31/00* (2006.01)
*H01G 9/035* (2006.01)
*H01G 9/20* (2006.01)
*H01L 51/00* (2006.01)

(52) U.S. Cl.
CPC .............. *H01G 9/035* (2013.01); *H01G 9/2009* (2013.01); *Y02E 10/542* (2013.01); *H01G 9/2059* (2013.01); *H01G 9/2031* (2013.01); *H01L 51/0086* (2013.01)
USPC ........................................................ 136/252

(58) Field of Classification Search
USPC ........................................................ 136/252
See application file for complete search history.

(56) References Cited

U.S. PATENT DOCUMENTS

| 5,491,248 A * | 2/1996 | Kondo et al. .................. 556/173 |
| 5,824,226 A * | 10/1998 | Boyd et al. ..................... 210/679 |
| 2004/0241551 A1 * | 12/2004 | Nakamura et al. ............ 429/303 |

(Continued)

FOREIGN PATENT DOCUMENTS

| JP | 2007-188809 A | 7/2007 |
| JP | 2007-531206 A | 11/2007 |

(Continued)

OTHER PUBLICATIONS

Perry A., Is Montmorillonite Clay the Same as Bentonite, AboutClay.com, Jul. 15, 2009.*

*Primary Examiner* — Eli Mekhlin
(74) *Attorney, Agent, or Firm* — Carrier Blackman & Associates, P.C.; Joseph P. Carrier; Anne G. Sabourin

(57) ABSTRACT

An object of the present invention is to provide an electrolyte for a photoelectric conversion element that can achieve superior moisture resistance, and a photoelectric conversion element and a dye-sensitized solar cell using the electrolyte. The electrolyte for a photoelectric conversion element of the present invention includes an organic solvent (A) and a lamellar clay mineral (B). The organic solvent (A) has a boiling point of 150° C. or higher, and a relative dielectric constant of 20 or higher.

9 Claims, 1 Drawing Sheet

(56) References Cited

U.S. PATENT DOCUMENTS

| | | |
|---|---|---|
| 2007/0042266 A1* | 2/2007 | Oh et al. .................. 429/188 |
| 2007/0275546 A1 | 11/2007 | Maruyama et al. |
| 2010/0132790 A1* | 6/2010 | Lawandy .................. 136/256 |
| 2010/0275979 A1 | 11/2010 | Maruyama |
| 2012/0301992 A1* | 11/2012 | Chiba et al. .................. 438/64 |

FOREIGN PATENT DOCUMENTS

| | | |
|---|---|---|
| JP | 2008-071749 A | 3/2008 |
| JP | 2011-181326 A | 9/2011 |
| WO | WO 2008020643 A1 * | 2/2008 |
| WO | WO 2011093253 A1 * | 8/2011 |

* cited by examiner

ELECTROLYTE FOR PHOTOELECTRIC CONVERSION ELEMENT, AND PHOTOELECTRIC CONVERSION ELEMENT AND DYE-SENSITIZED SOLAR CELL USING SAME

TECHNICAL FIELD

The present invention relates to an electrolyte for photoelectric conversion elements, and a photoelectric conversion element and a dye-sensitized solar cell using the electrolyte.

BACKGROUND OF THE INVENTION

In recent years, environmental issues such as global warming and the like that are attributed to increases in carbon dioxide have become serious. As a result, non-silicon solar cells have gained attention as solar cells that have little environmental impact and that also allow for reduced manufacturing costs; and research and development of such is moving forward.

Among non-silicon solar cells, the dye-sensitized solar cell developed by Graetzel et al. in Switzerland has attracted attention as a new type of solar cell. As a solar cell using organic materials, these solar cells have advantages such as high photoelectric conversion efficiency and lower manufacturing costs than silicon solar cells.

However, dye-sensitized solar cells are electrochemical cells, and therefore use organic electrolytic solutions and/or ionic liquids as electrolytes. In cases where organic electrolytic solutions are used, there is a problem in that electrical efficiency decreases due to volatilization and depletion during long-term use. Additionally, in cases where ionic liquids are used, while volatilization and depletion that occur during long-term use can be prevented, there are durability problems such as structural degradation caused by liquid leakage.

Therefore, research is being conducted regarding converting the electrolyte from a liquid to a gel or solid for the purpose of preventing the volatilization and liquid leakage of the electrolytic solution and ensuring the long-term stability and durability of the solar cell.

For example, Patent Document 1 describes an electrolyte for a photoelectric conversion element comprising (i) a lamellar clay mineral and/or an organically modified lamellar clay mineral and (ii) an ionic liquid (claim 1).

PRIOR ART DOCUMENTS

Patent Documents

Patent Document 1: Japanese Unexamined Patent Application Publication (translation of PCT application) No. 2007-531206

SUMMARY OF THE INVENTION

Problem to be Solved by the Invention

The present inventors discovered, as a result of investigating the photoelectric conversion element using the electrolyte for a photoelectric conversion element described in Patent Document 1, that when allowed to sit at rest at about 85% RH (relative humidity) for about 200 hours or longer, there are cases where the photoelectric conversion efficiency declines. This is thought to be due to the electrolyte or sensitizing dye being altered by moisture or humidity that has entered the photoelectric conversion element.

Therefore, an object of the present invention is to provide an electrolyte for a photoelectric conversion element that can achieve superior moisture resistance, and a photoelectric conversion element and a dye-sensitized solar cell using the electrolyte.

Means to Solve the Problem

As a result of diligent research, the present inventors discovered that an electrolyte for a photoelectric conversion element including a specific organic solvent can achieve superior moisture resistance, and thus arrived at the present invention.

Specifically, the present invention provides the following (a) to (g).

(a) An electrolyte for a photoelectric conversion element including an organic solvent (A) and a lamellar clay mineral (B), wherein
the organic solvent (A) has a boiling point of 150° C. or higher, and a relative dielectric constant of 20 or higher.

(b) The electrolyte for a photoelectric conversion element described in (a), wherein the lamellar clay mineral (B) contains an alkylsilyl group.

(c) The electrolyte for a photoelectric conversion element described in (a) or (b), further including an organic salt compound (C) having a tertiary or quaternary cation.

(d) The electrolyte for a photoelectric conversion element described in (c), wherein the organic salt compound (C) has a thiocyanate anion.

(e) The electrolyte for a photoelectric conversion element described in (c) or (d), wherein the organic salt compound (C) contains a cation that is expressed by the following Formula (1) or (2).

In Formula (1), $R^1$ is a hydrocarbon group having from 1 to 20 carbons that may contain a hetero atom, and may include a substituent having from 1 to 20 carbons that may contain a hetero atom. $R^2$ and $R^3$ are each independently a hydrogen atom or a hydrocarbon group having from 1 to 20 carbons, and may contain a hetero atom. However, the $R^3$ moiety is absent if the nitrogen atom contains a double bond. In Formula (2), Q is a nitrogen, oxygen, phosphorus, or sulfur atom; and $R^4$, $R^5$, $R^6$, and $R^7$ are each independently a hydrogen atom or a hydrocarbon group having from 1 to 8 carbons that may contain a hetero atom. However, the $R^7$ moiety is absent if Q is an oxygen or a sulfur atom and, if Q is a sulfur atom, $R^4$ and $R^5$ may be linked.

(f) A photoelectric conversion element including: a photoelectrode having a transparent conductive film and a metal oxide semiconductor porous film;
a counterelectrode disposed opposite the photoelectrode; and
an electrolyte layer disposed between the photoelectrode and the counterelectrode, wherein the electrolyte layer is the electrolyte for a photoelectric conversion element described in any of (a) to (e).

(g) A dye-sensitized solar cell including the photoelectrode described in (f) above carrying a photosensitized dye.

Effect of the Invention

As described below, the present invention is useful for providing an electrolyte for a photoelectric conversion element that can achieve superior moisture resistance, and a photoelectric conversion element and a dye-sensitized solar cell using the electrolyte.

Additionally, because moisture resistance is superior, the dye-sensitized solar cell of the present invention is extremely useful in that it can be applied, for example, to usage environments exposed to outside air where humidity fluctuates greatly.

BRIEF DESCRIPTION OF THE DRAWINGS

FIG. 2 is a drawing illustrating a basic configuration of a dye-sensitized solar cell of the present invention used in the Working Examples and the like.

BEST MODE FOR CARRYING OUT THE INVENTION

[Electrolyte for a Photoelectric Conversion Element]

Figure 1:
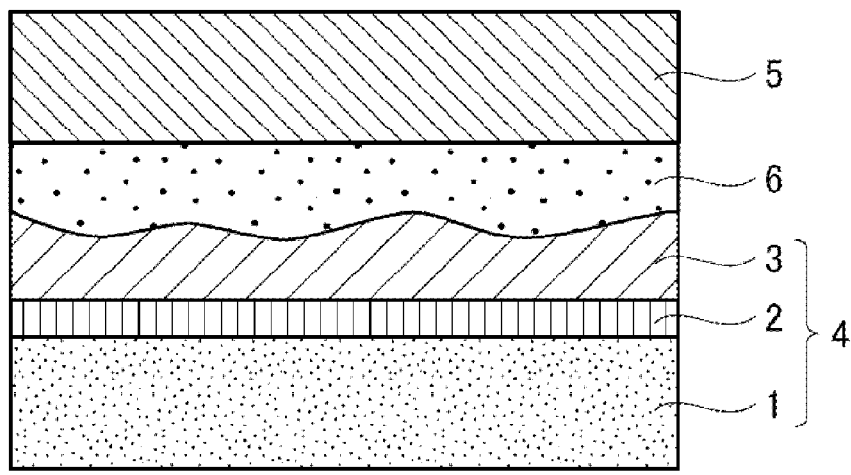
FIG. 1 is a schematic cross-sectional view illustrating an example of a basic configuration of a photoelectric conversion element of the present invention.

The electrolyte for a photoelectric conversion element of the present invention (hereinafter also referred to as the "electrolyte of the present invention") includes an organic solvent (A) and a lamellar clay mineral (B). The organic solvent (A) has a boiling point of 150° C. or higher, and a relative dielectric constant of 20 or higher.

Additionally, from the perspective of suppressing volatilization and in order to obtain high stability of the photoelectrode, the electrolyte of the present invention preferably includes an organic salt compound (C) having a tertiary or quaternary cation.

Next, each constituent of the electrolyte of the present invention will be described in detail.

<Organic Solvent (A)>

The organic solvent (A) used in the electrolyte of the present invention is not particularly limited provided that it has a boiling point that is 150° C. or higher and a relative dielectric constant of 20 or greater.

Here, "boiling point" refers to a boiling point at 1 atmosphere and "relative dielectric constant" refers to a value measured using a Liquid Dielectric Constant Meter (Liquid Dielectric Constant Meter Model M-870, manufactured by Nihon Rufuto, Co., Ltd.), having 25° C. and 10 kHz applied.

Specific examples of the organic solvent (A) include methoxypropionitrile (boiling point: 166° C., relative dielectric constant: 25), ethoxypropionitrile (boiling point: 171° C., relative dielectric constant: 22), butoxypropionitrile (boiling point: 206° C., relative dielectric constant: 20), dimethoxypropionitrile (boiling point: 195° C., relative dielectric constant: 28), glutaronitrile (boiling point: 286° C., relative dielectric constant: 20), ethylene glycol bis(propionitrile) ether (boiling point: 330° C., relative dielectric constant: 20), propylene carbonate (boiling point: 240° C., relative dielectric constant: 65), diethyl carbonate (boiling point: 240° C., relative dielectric constant: 65), ethyl methyl carbonate (boiling point: 240° C., relative dielectric constant: 65), γ-butyrolactone (boiling point: 205° C., relative dielectric constant: 65), γ-valerolactone (boiling point: ° C., relative dielectric constant: 58), dimethyl sulfoxide (boiling point: 189° C., relative dielectric constant: 47), ethyl isopropyl sulfone (boiling point: 250° C., relative dielectric constant: 32), sulfolane (boiling point: 285° C., relative dielectric constant: 38), methylsulfolane (boiling point: 270° C., relative dielectric constant: 32), and the like. One of these may be used alone, or two or more may be used in combination. Note that when two or more of these are used in combination, for example, a high dielectric constant solvent (cyclic carbonates) such as ethylene carbonate, propylene carbonate, butylene carbonate, or the like; and a low viscosity solvent (chain carbonates) such as dimethyl carbonate, ethylmethyl carbonate, diethyl carbonate, ethyl-n-butyl carbonate, methyl-t-butyl carbonate, di-i-propyl carbonate, t-butyl-i-propyl carbonate, or the like may be appropriately mixed so long as the object of the present invention is not impaired.

Of these, methoxypropionitrile, ethoxy propionitrile, or butoxy propionitrile is preferably used because the photoelectric conversion efficiency of the photoelectric conversion element using the electrolyte of the present invention (hereinafter also referred to as the "photoelectric conversion element of the present invention") will be better; propylene carbonate, diethyl carbonate, ethylmethyl carbonate, or γ-butyrolactone is preferably used because of being readily available and low cost; and ethyl isopropyl sulfone, sulfolane, or methyl sulfolane is preferably used because of being electrochemically stable and because little cracked gas is generated.

In the present invention, by including the organic solvent (A) described above, a photoelectric conversion element having superior moisture resistance can be formed.

While the reasons why this is so are not specifically clear, it is thought that this is a result of the hygroscopicity of the organic solvent (A) being lower than that of the ionic liquid, volatilization when used for an extended period of time being low, and solubility with respect to other electrolyte components being high. Additionally, it is thought that, due to the lamellar clay mineral (B) (described below) being dispersed in the organic solvent (A), intrusion of water vapor in the air can be suppressed and, furthermore, that moisture that has entered the electrolyte layer of the photoelectric conversion element of the present invention is trapped between the layers of the lamellar clay mineral (B), thus leading to modification, detachment, and the like of the photosensitized dye held in the electrolyte layer or in the photoelectrode being suppressed.

In the present invention, a content of the organic solvent (A) is preferably from 50 to 95 mass %, and more preferably from 55 to 90 mass % of a total mass of the electrolyte of the present invention. If the content is within this range, the photoelectric conversion efficiency of the photoelectric conversion element of the present invention will be better.

<Lamellar Clay Mineral (B)>

The lamellar clay mineral (B) that is used in the electrolyte of the present invention is not particularly limited, but is preferably a phyllosilicate having a silicic acid tetrahedron bonded in a bi-dimensional sheet-like form. Specific examples thereof include smectite-based clay minerals such as montmorillonite, bentonite, saponite, beidellite, nontronite, hectorite, stevensite, and the like; vermiculite-based clay minerals such as vermiculite and the like; mica-based clay minerals such as muscovite, phlogopite, mica, and the like. One of these may be used alone, or two or more may be used in combination.

In addition, lamellar clay mineral (B) that is used in the electrolyte of the present invention may be a natural material or a synthesized product.

Of these, smectite-based clay minerals that expand in water and have cation exchange capacity or expanding mica is preferable.

Here, a cation exchange capacity of the lamellar clay mineral is preferably from 10 to 300 milliequivalents/100 g.

Preferable examples of commercially available product that can be used as such a lamellar clay mineral (B) include natural montmorillonite (trade name: Kunipia F, manufactured by Kunimine Industries Co., Ltd.; average particle size: 0.1 to 1 μm), synthetic smectite (trade name: Sumecton SA, manufactured by Kunimine Industries Co., Ltd.; average particle size: 20 nm), synthetic expanding mica (trade name: Somasif ME-100, manufactured by Co-op Chemical Co., Ltd.; average particle size: 1 to 3 μm); synthetic smectite (trade name: Lucentite SWN, manufactured by Co-op Chemical Co., Ltd.; average particle size: 0.02 μm); and synthetic smectite (trade name: Lucentite SWF, manufactured by Co-op Chemical Co., Ltd.; average particle size: 0.02 μm).

In the present invention, an organically modified lamellar clay mineral can be used as the lamellar clay mineral (B).

The organically modified lamellar clay mineral can be obtained by regular inter-layer cation-exchanging and, for example, can be obtained by adding organic onium ions to a water-based slurry of the lamellar clay mineral and mixing in order to induce a reaction.

Here, the "organic onium ions" are ions that are generated from an organic onium compound produced by coordinate bonding a proton or another cationic reagent, or the like to a lone electron pair in a compound including an element such as oxygen, sulfur, nitrogen, and the like that has a lone electron pair.

Additionally, conditions for organically modifying using the organic onium ions are not particularly limited, and the reaction is preferably induced using an amount of the organic onium ions 0.3 to 2.0 times, and more preferably induced using an amount of the organic onium ions 0.5 to 1.5 times the cation exchange capacity of the lamellar clay mineral, and the reaction is preferably induced at a temperature of from 10 to 95° C.

Examples of the organic onium ions include ammonium ions, phosphonium ions, oxonium ions, sulfonium ions, and the like.

Of these, ammonium ions are the most common, and specific examples thereof include aliphatic ammonium ions, pyridinium ions, quinolinium ions, imidazolium ions, pyrrolidinium ions, piperidinium ions, betaines, lecithin, cation dyes (pigments), and the like.

Additionally, the aliphatic ammonium ions expressed by Formulas (I) and (II) below are preferable, and examples thereof include hydroxypolyoxyethylene trialkylammonium, hydroxypolyoxypropylene trialkylammonium, di(hydroxypolyoxyethylene)dialkylammonium, di(hydroxypolyoxypropylene)dialkylammonium, dimethyldioctylammonium, dimethyldidodecylammonium, methylethyldioctylammonium, methylethyldioctylammonium, methyltrioctylammonium, methyltridodecylammonium, benzylmethyldioctylammonium, benzylmethyldidodecylammonium, benzylethyldioctylammonium, benzylethyldioctylammonium, benzyltrioctylammonium, benzyltridodecylammonium, and the like.

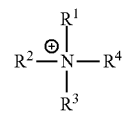

(I)

In Formula (I), $R^1$ is a hydrocarbon group having from 1 to 30 carbons; $R^2$ and $R^3$ are each independently a polyoxyethylene group ($—(CH_2CH_2O)_n—H$), a polyoxypropylene group) ($—(CH_2CH(CH_3)O)_n—H$, $—(CH_2CH_2CH_2O)_n—H$), or a hydrocarbon group having from 1 to 10 carbons; and $R^4$ is a polyoxyethylene group) ($—(CH_2CH_2O)_n—H$) or a polyoxypropylene group ($—(CH_2CH(CH_3)O)_n—H$, $—(CH_2CH_2CH_2O)_n—H$). Moreover, n is an integer from 1 to 50.

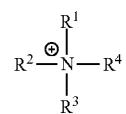

(II)

In Formula (II), $R^1$ is a methyl group or a benzyl group; $R^2$ is a hydrocarbon group having from 1 to 3 carbons or a hydrocarbon group having from 6 to 15 carbons; and $R^3$ and $R^4$ are each independently a hydrocarbon group having from 6 to 15 carbons.

Examples of commercially available products that can be used as such an organically modified lamellar clay mineral include S-BEN NX, S-BEN WX, Organite, and Organite D (all manufactured by Hojun Yoko K.K.); Lucentite SEN, Lucentite SPN, Lucentite SAN, Lucentite STN, Somasif MAE, Somasif MEE, Somasif MPE, and Somasif MTE (all manufactured by Co-op Chemical Co., Ltd.); and the like.

In the present invention, from the perspective of improving the moisture resistance of the photoelectric conversion element of the present invention, the lamellar clay mineral (B) preferably contains an alkylsilyl group.

Examples of the lamellar clay mineral (B) containing an alkylsilyl group include reactant products of the lamellar clay minerals described above (hereinafter also referred to as "lamellar clay mineral (b1)") and an organosilane compound (b2) described below; commercially available products described below; and the like.

Organosilane Compound (b2)

Examples of the organosilane compound (b2) used in the preparation of the lamellar clay mineral (B) include compounds expressed by Formula (III) below.

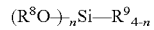

(III)

In Formula (III), $R^8$ is a monovalent hydrocarbon group that may be branched, having from 1 to 25 carbons, and may contain a hetero atom. $R^9$ is a hydrolyzable group, and n is an integer from 1 to 3. When n is 2 or 3, the plurality of $R^8$ moieties may be the same or different, and when n is 1 or 2, the plurality of $R^9$ moieties may be the same or different.

Examples of the monovalent hydrocarbon group that may be branched, having from 1 to 25 carbons in Formula (III), $R^8$, include methyl groups, ethyl groups, propyl groups, isopropyl groups, n-butyl groups, isobutyl groups, sec-butyl groups, tert-butyl groups, n-pentyl groups, isopentyl groups, neopentyl groups, tert-pentyl groups, 1-methylbutyl groups, 2-methylbutyl groups, 1,2-dimethylpropyl groups, hexyl groups, heptyl groups, octyl groups, nonyl groups, decyl groups, dodecyl groups, tridecyl groups, tetradecyl groups, hexadecyl groups, octadecyl groups, cyclohexyl groups, vinyl groups, allyl groups, phenyl groups, tolyl groups, styryl groups, α-methylstyryl groups, and the like; functional groups (e.g. chloromethyl groups, chloropropyl groups, trifluoropropyl groups, and the like) wherein part or all of the hydrogen atoms bonded to the carbon atoms of the groups described above are substituted with a halogen atom (e.g. fluorine, chlorine and the like); and the like.

Moreover, examples of the hydrolyzable group in Formula (III), $R^9$, include alkoxy groups, acyl groups, halogen groups, and the like.

Examples of the compound expressed by Formula (III) include methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, n-butyltrimethoxysilane, n-butyltriethoxysilane, n-pentyltrimethoxysilane, n-pentyltriethoxysilane, cyclohexyltrimethoxysilane, phenyltrimethoxysilane, hexyltrimethoxysilane, octyltriethoxysilane, nonyltriethoxysilane, decyltriethoxysilane, dodecyltriethoxysilane, tridecyltriethoxysilane, tetradecyltriethoxysilane, pentadecyltriethoxysilane, dimethyldimethoxysilane, dimethyldiethoxysilane, diethyldimethoxysilane, diethyldiethoxysilane, di-n-propyldimethoxysilane, di-i-propyldimethoxysilane, di-n-butyldimethoxysilane, n-pentyl.methyldimethoxysilane, cyclohexyl.methyldiethoxysilane, phenyl.methyldimethoxysilane, di-n-pentyldimethoxysilane, di-n-hexyldimethoxysilane, di-n-heptyldimethoxysilane, di-n-octyldimethoxysilane, dicyclohexyldimethoxysilane, diphenyldimethoxysilane, trimethylmethoxysilane, triethylmethoxysilane, tri-n-propylmethoxysilane, tri-i-propylmethoxysilane, tri-n-butylmethoxysilane, tri-n-pentylmethoxysilane, tri-cyclohexylmethoxysilane, triphenylmethoxysilane, tri-n-hexylmethoxysilane, tri-n-heptylmethoxysilane, tri-n-octylmethoxysilane, tricyclohexylmethoxysilane, triphenylmethoxysilane, tridecylmethoxysilane, vinyltrichlorosilane, vinyltrimethoxysilane, vinyltriethoxysilane, vinyl-tris(methoxyethoxy)silane, vinyltriisopropoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-acryloxypropyltrimethoxysilane, 3-mercaptopropylmethyldimethoxysilane, 3-mercaptopropyltrimethoxysilane, bis(triethoxysilylpropyl)disulfide, bis(triethoxysilylpropyl)tetrasulfide, methyltrichlorosilane, methyldichlorosilane, dimethyldichlorosilane, trimethylchlorosilane, phenyltrichlorosilane, diphenyldichlorosilane, octyldimethylchlorosilane, trifluoropropyltrichlorosilane, cyclohexylmethyldimethoxysilane, trifluoropropyltrimethoxysilane, triphenylsilanol, hexamethyldisilazane, methyltriphenoxysilane, and the like. One of these may be used alone, or two or more may be used in combination.

Of these, from the perspective of being able to suppress hygroscopicity of the electrolyte in an element, methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, n-butyltrimethoxysilane, n-butyltriethoxysilane, n-pentyltrimethoxysilane, n-pentyltriethoxysilane, cyclohexyltrimethoxysilane, phenyltrimethoxysilane, hexyltrimethoxysilane, octyltriethoxysilane, nonyltriethoxysilane, dimethyldimethoxysilane, dimethyldiethoxysilane, diethyldimethoxysilane, diethyldiethoxysilane, di-n-propyldimethoxysilane, di-i-propyldimethoxysilane, di-n-butyldimethoxysilane, n-pentyl-methyldimethoxysilane, cyclohexyl-methyldiethoxysilane, phenyl-methyldimethoxysilane, diphenyldimethoxysilane, trimethylethoxysilane, triethylmethoxysilane, tri-n-propylmethoxysilane, tri-i-propylmethoxysilane, vinyltrimethoxysilane, vinyltriethoxysilane, 3-mercaptopropyltrimethoxysilane, bis(triethoxysilylpropyl)disulfide, bis(triethoxysilylpropyl)tetrasulfide, cyclohexylmethyldimethoxysilane, trifluoropropyltrimethoxysilane, hexamethyldisilazane, dimethoxymethyl trifluoropropylsilane, nonafluoro hexyltrichlorosilane, trifluoropropyl trichlorosilane, and methyltrifluoropropyl dichlorosilane are preferable.

Additionally, examples that can be used as the organosilane compound (b2) include condensation products of the compounds expressed by formula (III) including organopolysiloxane such as dimethylpolysiloxane, methylphenylpolysiloxane, methylhydrogenpolysiloxane, and the like.

Furthermore, organodisilazanes such as hexamethyldisilazane, divinyltetramethyldisilazane, and the like can be used as the organosilane compound (b2).

In the present invention, the reaction of the lamellar clay mineral (b1) and the organosilane compound (b2) described above is not particularly limited, and the lamellar clay mineral (B) containing an alkylsilyl group can be prepared by stirring these in an organic solvent such as methanol or the like at a temperature from about 0 to 250° C., thereby reacting the hydroxy group contained in the lamellar clay mineral (b1) and the hydrolyzable group contained in the organosilane compound (b2).

Here, "the hydroxy group contained in the lamellar clay mineral (b1)" refers to the hydroxy group generally contained in the crystalline layer (in most cases, the end face) of a known lamellar clay mineral such as montmorillonite, smectite, or the like. However, in the reaction described above, all of the hydroxy groups contained in the lamellar clay mineral (b1) need not be substituted by alkylsilyl groups.

Note that in the reaction described above, following or simultaneous with the reaction between the lamellar clay mineral (b1) and the organosilane compound (b2), a hydrolyzable group derived from the organosilane compound (b2) (the functional group unreacted with the lamellar clay mineral (b1)) may be hydrolyzed or condensed.

On the other hand, in the present invention, examples of products that can be preferably used as the lamellar clay mineral (B) containing an alkylsilyl group include commercially available products such as silane-treated montmorillonite treated with alkyltrialkoxysilane (Bengel SH, manufactured by Hojun Co., Ltd.), silane-treated organic bentonite treated with quaternary ammonium and alkyltrialkoxysilane (manufactured by Hojun Co., Ltd.), and the like.

By including the lamellar clay mineral (B) containing an alkylsilyl group described above, a photoelectric conversion element having superior moisture resistance can be formed.

While the reasons why this is so are not specifically clear, it is thought that the lamellar clay mineral (B) containing the alkylsilyl group prevents the intrusion of atmospheric water vapor due to it being hydrophobized to a greater degree than conventional lamellar clay minerals.

In the present invention, the content of the lamellar clay mineral (B), when indicated as the content of inorganic matter, is preferably from 0.1 to 250 parts by mass, and more preferably from 0.5 to 150 parts by mass, per 100 parts by mass of the organic solvent (A).

Here, "indicated as a content of inorganic matter" takes into account the content of the organically modified lamellar clay mineral, and, when using the organically modified lamellar clay mineral, refers to the mass excluding the inter-layer cations, specifically the organic onium ions. Note that lamellar clay mineral that is not organically modified is an inorganic material including inter-layer cations (e.g. $Na^+$, $K^+$, $Li^+$ and the like). Therefore, the value of the content indicated as inorganic matter and the content indicated as the entire product are the same.

<Organic Salt Compound (C)>

The organic salt compound (C) included optionally in the electrolyte of the present invention is an organic salt compound that has a tertiary or quaternary cation as well as its counter ion (i.e. anion). The organic salt compound (C) used in the electrolyte of the present invention is preferably a solid or a liquid at room temperature, i.e. is a so-called ionic liquid.

Here, "tertiary cation" refers to a cation of a periodic table group 16 element (e.g. oxygen atom, sulfur atom, or the like) having a positive charge that does not include a hydrogen atom. "Quaternary cation" refers to a cation of a periodic table group 15 element (e.g. nitrogen atom, phosphorous atom, or the like) having a positive charge that does not include a hydrogen atom.

Specific preferred examples of the cations included in the aforementioned organic salt compound (C) include the cations indicated by the below Formulas (1) and (2).

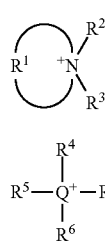

(1)

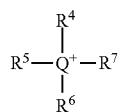

(2)

In formula (1), $R^1$ is a hydrocarbon group having from 1 to 20 carbons that may contain a hetero atom, and may include a substituent having from 1 to 20 carbons that may contain a hetero atom. $R^2$ and $R^3$ are each independently a hydrogen atom or a hydrocarbon group having from 1 to 20 carbons, and may contain a hetero atom. However, the $R^3$ moiety is absent if the nitrogen atom contains a double bond.

In formula (2), Q is a nitrogen, oxygen, phosphorus, or sulfur atom; and $R^4$, $R^5$, $R^6$, and $R^7$ are each independently a hydrogen atom or a hydrocarbon group having from 1 to 8 carbons that may contain a hetero atom. However, the $R^7$ moiety is absent if Q is an oxygen or a sulfur atom and, if Q is a sulfur atom, $R^4$ and $R^5$ may be linked.

The hydrocarbon group in Formula (1) having from 1 to 20 carbons that may contain a hetero atom, $R^1$, preferably has a ring structure along with the nitrogen atom (ammonium ion) in Formula (1).

Next, preferable examples of the substituent, having from 1 to 20 carbons and that may contain a hetero atom that $R^1$ in Formula (1) may include, include alkyl groups having from 1 to 20 carbons (e.g. a methyl group, an ethyl group, a propyl group, a butyl group, a pentyl group, a hexyl group, a heptyl group, an octyl group, an ethylhexyl group, a nonyl group, a decyl group, a dodecyl group, an undecyl group, a hexadecyl group, an octadecyl group, a cyclopropylmethyl group, a trifluoroethyl group, and the like); alkenyl groups having from 2 to 20 carbons (e.g. a vinyl group, an allyl group, and the like); aryl groups having from 6 to 20 carbons (e.g. a phenyl group, a tolyl group, a naphthyl group, and the like); aralkyl groups having from 7 to 20 carbons (e.g. a benzyl group, a phenylethyl group, a phenylpropyl group, and the like); alkoxy groups having from 1 to 20 carbons (e.g. a methoxy group, an ethoxy group, an n-propoxy group, an iso-propoxy group, an n-butoxy group, a tert-butoxy group, a sec-butoxy group, an n-pentoxy group, an n-hexoxy group, a 1,2-dimethylbutoxy group, a heptoxy group, an octoxy group, a nonynoxy group, a decyloxy group, a phenoxy group, a methyl phenoxy group, an ethyl phenoxy group, and the like); and alkylalkoxy groups having from 2 to 20 carbons (e.g. a methylene methoxy group (—$CH_2OCH_3$), an ethylene methoxy group (—$CH_2CH_2OCH_3$), an n-propylene-iso-propoxy group (—$CH_2CH_2CH_2OCH(CH_3)_2$), a methylene-t-butoxy group (—$CH_2$—O—$C(CH_3)_3$), a butylene methoxy group, a pentylene methoxy group, a hexylene methoxy group, a heptylene methoxy group, an octylene methoxy group, a nonylene methoxy group, a decylene methoxy group, a methylene ethoxy group, an ethylene ethoxy group, a propylene ethoxy group, a butylene ethoxy group, a pentylene ethoxy group, a hexylene ethoxy group, an ethylene ethoxy methoxy group, a cyclopropyl methoxy group, a cyclohexyl methoxy group, a methyl phenoxy group, a methoxy phenoxy group, an ethoxy phenoxy group, a phenoxy phenoxy group, and the like). Additionally, $R^2$ in Formula (1) may include two or more of these substituents.

Next, specific examples of the hydrocarbon group, having from 1 to 20 carbons and that may contain a hetero atom, $R^2$ and $R^3$, in Formula (1) include alkyl groups having from 1 to 20 carbons (e.g. a methyl group, an ethyl group, a propyl group, a butyl group, a pentyl group, a hexyl group, a heptyl group, an octyl group, an ethylhexyl group, a nonyl group, a decyl group, a dodecyl group, an undecyl group, a hexadecyl group, an octadecyl group, a cyclopropylmethyl group, a trifluoroethyl group, and the like); alkenyl groups having from 2 to 20 carbons (e.g. a vinyl group, an allyl group, and the like); aryl groups having from 6 to 20 carbons (e.g. a phenyl group, a tolyl group, a naphthyl group, and the like); aralkyl groups having from 7 to 20 carbons (e.g. a benzyl group, a phenylethyl group, a phenylpropyl group, and the like); alkoxy groups having from 1 to 20 carbons (e.g. a methoxy group, an ethoxy group, an n-propoxy group, an iso-propoxy group, an n-butoxy group, a tert-butoxy group, a sec-butoxy group, an n-pentoxy group, an n-hexoxy group, a 1,2-dimethylbutoxy group, a heptoxy group, an octoxy group, a nonynoxy group, a decyloxy group, a phenoxy group, a methyl phenoxy group, an ethyl phenoxy group, and the like); and alkylalkoxy groups having from 2 to 20 carbons (e.g. a methylene methoxy group (—$CH_2OCH_3$), an ethylene methoxy group (—$CH_2CH_2OCH_3$), an n-propylene-iso-propoxy group (—$CH_2CH_2CH_2OCH(CH_3)_2$), a methylene-t-butoxy group (—$CH_2$—O—$C(CH_3)_3$), a butylene methoxy group, a pentylene methoxy group, a hexylene methoxy group, a heptylene methoxy group, an octylene methoxy group, a nonylene methoxy group, a decylene methoxy group, a methylene ethoxy group, an ethylene ethoxy group, a propylene ethoxy group, a butylene ethoxy group, a pentylene ethoxy group, a hexylene ethoxy group, an ethylene ethoxy methoxy group, a cyclopropyl methoxy group, a cyclohexyl methoxy group, a methyl phenoxy group, a methoxy phenoxy group, an ethoxy phenoxy group, a phenoxy phenoxy group, and the like).

Additionally, preferable specific examples of the hydrocarbon group, having from 1 to 8 carbons and that may contain a hetero atom, $R^4$, $R^5$, $R^6$, and $R^7$ in Formula (2) include alkyl groups having from 1 to 8 carbons (e.g. a methyl group, an ethyl group, a propyl group, a butyl group, a pentyl group, a hexyl group, a heptyl group, an octyl group, and the like), alkoxy groups having from 1 to 8 carbons (e.g. a methoxy group, an ethoxy group, an n-propoxy group, an iso-propoxy group, an n-butoxy group, a tert-butoxy group, a sec-butoxy group, an n-pentoxy group, an n-hexoxy group, a 1,2-dimethylbutoxy group, and the like), alkylalkoxy groups having from 2 to 8 carbons (e.g. a methoxymethylene group (—CH$_2$OCH$_3$), a methoxyethylene group (—CH$_2$CH$_2$OCH$_3$), an n-propylene-iso-propoxy group (—CH$_2$CH$_2$CH$_2$OCH(CH$_3$)$_2$), a methylene-t-butoxy group (—CH$_2$—O—C(CH$_3$)$_3$, and the like), and the like.

Examples of the cations expressed by Formula (1) include imidazolium ions, pyridinium ions, pyrrolidinium ions, piperidinium ions, and the like.

Specific examples of preferred cations include the cations expressed by any of Formulas (3) to (6) below.

Of these, the cations expressed by the following Formulas (3) and (5) are preferable because the photoelectric conversion efficiency of the photoelectric conversion element of the present invention tends to be better.

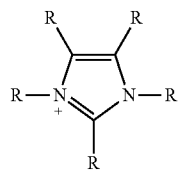

(3)

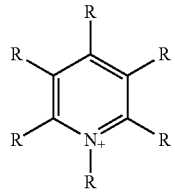

(4)

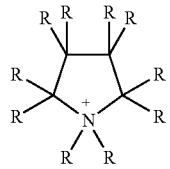

(5)

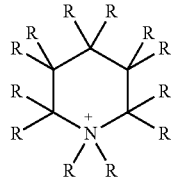

(6)

In Formulas (3) to (6), each R is independently a hydrocarbon group having from 1 to 20 carbons that may contain a hetero atom.

More specific examples include the following cations.

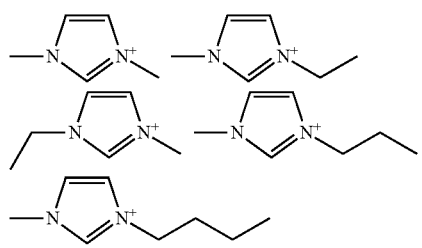

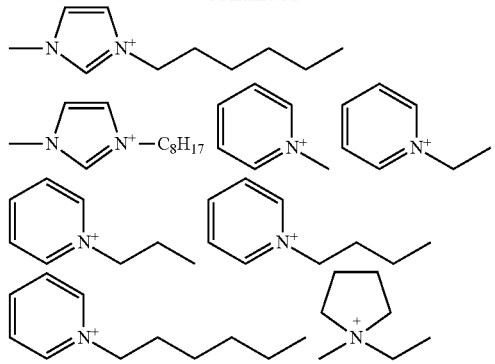

Examples of the cations of Formula (2) include organic cations such as ammonium ions, sulfonium ions, phosphonium ions, oxonium ions, and the like.

Specific examples of preferable cations are listed below.

Of these, aliphatic quarternary ammonium ions and sulfonium ions (particularly thiophenium ions) are preferable because the photoelectric conversion efficiency of the photoelectric conversion element of the present invention tends to be better.

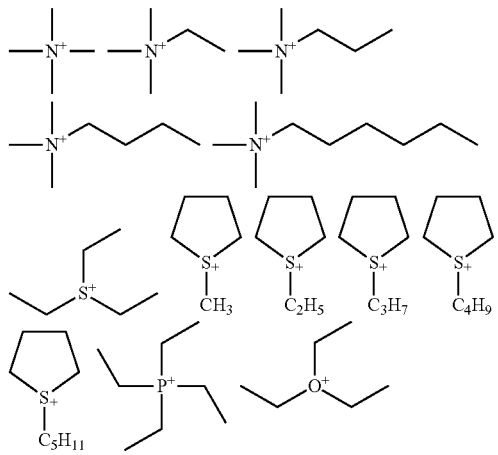

On the other hand, specific examples of preferable anions contained in the organic salt compound (C) include I$^-$, Br$^-$, AlCl$_4^-$, Al$_2$Cl$_7^-$, NO$_3^-$, BF$_4^-$, PF$_6^-$, CH$_3$COO$^-$, CF$_3$COO$^-$, CF$_3$SO$_3^-$, (CN)$_4$B$^-$, SCN$^-$, (CF$_3$SO$_2$)$_2$N$^-$, (CN)$_2$N$^-$, (CF$_3$SO$_2$)$_3$C$^-$, (CN)$_3$C$^-$, AsF$_6^-$, SbF$_6^-$, F(HF)$_n^-$, CF$_3$CF$_2$CF$_2$CF$_2$SO$_3^-$, (CF$_3$CF$_2$SO$_2$)$_2$N$^-$, CF$_3$CF$_2$CF$_2$COO$^-$, and phosphonate anions (such as methylphosphonate).

Of these, the anions are preferably bromine ions (Br$^-$) or iodine ions (I$^-$) and more preferably iodine ions (I$^-$) because the photoelectric conversion efficiency of the photoelectric conversion element of the present invention tends to be better.

Moreover, the thiocyanate anion (SCN$^-$, including the isothiocyanate anion, which is a linkage isomer, hereinafter the same also) is preferably included from the standpoint of obtaining good heat resistance for the photoelectric conversion element of the present invention. Because it is thought that this is an effect achieved in cases where a metal complex in which a thiocyanate anion is coordinated (for example, the ruthenium complex dye mentioned below) is used, as indicated by the working examples shown below, it is thought that even in cases where the coordination of a thiocyanate anion is lost from a metal complex by heating, it is possible to re-coordinate the thiocyanate anion of the organic salt compound (C), the metal complex can function as a dye, that is, absorb light, and it is possible to maintain the function of emitting electrons.

The organic salt compound (C) is exemplified by organic salt compounds such as those resulting from combinations of the aforementioned cited cations and anions.

Among such organic salt compounds, from the standpoint of further improvement of photoelectric conversion efficiency of the photoelectric conversion element of the present invention, the organic salt compound preferably has the imidazolium ion as the cation and has an iodine ion as the anion. From the standpoint of obtaining good heat resistance for the photoelectric conversion element of the present invention, an organic salt compound that has the thiocyanate anion is preferred, and an organic salt compound having the imidazolium ion and iodine ion and an organic salt compound having the thiocyanate anion are further preferably jointly used.

Additionally, a synthesis method of the organic salt compound (C) is not particularly limited, and various types of organic salt compounds obtained by combining the cations and the anions described above can be synthesized by a conventionally known method.

Examples of synthesized products that can be used as the organic salt compound (C) include 1-methyl-3-methyl imidazolium iodide, 1-ethyl-3-methyl imidazolium iodide, 1-methyl-3-pentyl imidazolium iodide, 1-methyl-3-hexyl imidazolium iodide, 1-((2-methoxyethoxy)ethyl)-3-((2-methoxyethoxy)ethyl)imidazolium iodide, 1-methyl-1-butyl pyrrolidinium thiocyanate, 1-methyl-1-ethyl pyrrolidinium thiocyanate, and the like. Additionally, specific examples of commercially available products that can be used as the organic salt compound (C) include 1-methyl-3-propyl imidazolium iodide (manufactured by Tokyo Chemical Industry Co., Ltd.), 1-methyl-3-butyl imidazolium iodide (manufactured by Tokyo Chemical Industry Co., Ltd.), 1-methyl-1-methyl-pyrrolidinium iodide (manufactured by Sigma-Aldrich Co. LLC.), tetrapropyl ammonium iodide (manufactured by Tokyo Chemical Industry Co., Ltd.), tetrabutyl ammonium iodide (manufactured by Tokyo Chemical Industry Co., Ltd.), 1-ethyl-3-methylimidazolium tetracyanoborate (manufactured by Merck), 1-ethyl-3-methyl imidazolium thiocyanate (manufactured by Merck), 1-methyl-3-butyl imidazolium thiocyanate (manufactured by BASF), tetrapropyl ammonium thiocyanate (manufactured by Merck), 1-ethyl-3-methyl imidazolium bis(trifluoromethylsulfonyl)imide (manufactured by Solvent Innovation), 1-ethyl-3-methyl imidazolium methyl phosphonate (manufactured by Kanto Chemical Co., Ltd.), triethylhexyl phosphonium bis(trifluoromethylsulfonyl)amide (manufactured by Sigma-Aldrich Co. LLC.), trihexyltetradecyl phosphonium bis(trifluoromethylsulfonyl)amide (manufactured by Sigma-Aldrich Co. LLC.), and the like.

Moreover, because some organic salt compounds exhibit tautomerism, the organic salt compound (C) of the present invention include tautomers.

Specifically, "1-methyl-3-pentyl imidazolium iodide" includes "1-pentyl-3-methyl imidazolium iodide", which is a tautomer thereof, and "1-methyl-3-hexyl imidazolium iodide" includes "1-hexyl-3-methyl imidazolium iodide", which is a tautomer thereof.

If the above-mentioned organic salt compound (C) is contained in the present invention, the content thereof is preferably from 5 to 70 parts by mass, and more preferably from 10 to 60 parts by mass, relative to 100 parts by mass of the above-mentioned organic solvent (A).

In addition, if the organic salt compound (C) is contained in the present invention, a ratio (A/C) of the above-mentioned organic solvent (A) to the above-mentioned organic salt compound (C) is preferably from 59/41 to 95/5 and more preferably from 63/37 to 90/10 from the perspectives of maintaining superior moisture resistance of the photoelectric conversion element of the present invention and suppressing elution of a photosensitized dye (particularly an organic dye) in the dye-sensitized solar cell of the present invention.

<Other Ingredients>

A redox couple can be added to the electrolyte of the present invention in order to enhance the photoelectric conversion efficiency of the photoelectric conversion element of the present invention.

Any conventional product commonly used for, or that can be used for, dye-sensitized solar cells may be used as the redox couple so long as the object of the present invention is not impaired.

For example, iodine/iodide ion pairs, bromine/bromide ion pairs, and the like can be used. Specific examples include iodine/iodide ion pairs such as metal iodides of iodine and LiI, NaI, KI, or the like, iodine salts of iodine and a quaternary imidazolium compound, iodine salts of iodine and a quaternary pyridinium compound, iodide salts of iodine and a tetraalkylammonium compound, and the like; bromine/bromide ion pairs such as metal bromide salts of bromine and LiBr, NaBr, KBr, or the like, bromide salts of bromine and a quaternary imidazolium compound, bromide salts of bromine and a quaternary pyridinium compound, bromide salts of bromine and a tetraalkylammonium compound, and the like; metal complexes such as ferrocyanate-ferricyanate, ferrocene-ferricinium salt, cobalt complexes, and the like; sulfur compounds of a disulfide compound and a mercapto compound; hydroquinone-quinone; viologen dyes; and the like. One of these may be used alone, or two or more may be used in combination.

Of these, iodine/iodide ion pairs and bromine/bromide ion pairs are preferable.

Additionally, an inorganic salt and/or an organic salt can be added to the electrolyte of the present invention in order to enhance short-circuit current of the photoelectric conversion element of the present invention.

Examples of the inorganic salt and/or organic salt include alkali metals, alkali earth metal salts, and the like, such as lithium iodide, sodium iodide, potassium iodide, magnesium iodide, calcium iodide, lithium trifluoroacetate, sodium trifluoroacetate, lithium thiocyanate, lithium tetrafluoroborate, lithium hexaphosphate, lithium perchlorate, lithium trifluoromethanesulfonate, lithium bis(trifluoromethanesulphonyl)imide, and the like. One of these may be used alone, or two or more may be used in combination.

An added amount of the inorganic salt and/or organic salt is not particularly limited and may be a conventional amount so long as the object of the present invention is not inhibited.

Additionally, a pyridine and/or a benzimidazole can be added to the electrolyte of the present invention in order to enhance the open voltage of the photoelectric conversion element of the present invention.

Specific examples include alkylpyridines such as methylpyridine, ethylpyridine, propylpyridine, butylpyridine, and the like; alkylimidazoles such as methylimidazole, ethylimidazole, propylimidazole, and the like; alkylbenzimidazoles such as methylbenzimidazole, ethylbenzimidazole, butyl-benzimidazole, propylbenzimidazole, and the like; and the like. One of these may be used alone, or two or more may be used in combination.

An added amount of the pyridine and/or the benzimidazole is not particularly limited and can be a conventional amount so long as the object of the present invention is not inhibited.

An organic solvent other than the organic solvent (A) may be added to the electrolyte of the present invention, and specific examples thereof include carbonate esters such as ethylene carbonate, propylene carbonate, and the like; ethers such as ethylene glycol dialkyl ether, propylene glycol dialkyl ether, and the like; alcohols such as ethylene glycol monoalkyl ether, propylene glycol monoalkyl ether, and the like; polyhydric alcohols such as ethylene glycol, propylene glycol, and the like; nitriles such as acetonitrile, propionitrile, methoxypropionitrile, cyanoethyl ether, glutaronitrile, valeronitrile, and the like; lactones such as γ-butyrolactone and the like; amides such as dimethylformamide, N-methylpyrrolidone, and the like; aprotic polar solvents such as dimethyl sulfoxide, sulfolane, and the like; and the like. One of these may be used alone, or two or more may be used in combination.

A content of the organic solvent is not particularly limited and can be a conventional amount so long as the object of the present invention is not inhibited.

A manufacturing method of the electrolyte of the present invention is not particularly limited and can be, for example, manufactured by mixing the above-mentioned organic solvent (A), the lamellar clay mineral (B) and the optionally contained organic salt compound (C), and the like, and then thoroughly mixing and uniformly dispersing (kneading) using a ball mill, sand mill, pigment disperser, grinder, ultrasonic disperser, homogenizer, planetary mixer, Hobart mixer, roll, kneader, or the like at room temperature or under heating (for example, from 40 to 150° C.).

Here, as necessary, an organic solution (e.g. toluene or the like) can be mixed in with the mixture described above and, after the mixing, the organic solution may be removed using vacuum distillation.

[Photoelectric Conversion Element and Dye-sensitized Solar Cell]

Next, the photoelectric conversion element and the dye-sensitized solar cell of the present invention will be described using FIG. 1. FIG. 1 is a schematic cross-sectional view illustrating an example of a basic configuration of the photoelectric conversion element of the present invention.

The photoelectric conversion element of the present invention includes a photoelectrode having a transparent conductive film and a metal oxide semiconductor porous film, a counterelectrode disposed so as to oppose the photoelectrode, and an electrolyte layer disposed between the photoelectrode and the counterelectrode.

<Photoelectrode>

As illustrated in FIG. 1, the photoelectrode is, for example, constituted by a transparent plate 1, a transparent conductive film 2, and an oxide semiconductor porous film 3.

Here, the transparent plate 1 preferably has excellent optical transparency, and specific examples include, in addition to glass plates, resin plates (films) such as polystyrene, polyethylene, polypropylene, polyethylene terephthalate, polyethylene naphthalate, polycarbonate, polyphenylene sulfide, cyclic olefin polymer, polyether sulfone, polysulfone, polyetherimide, polyarylate, triacetylcellulose, methyl polymethacrylate, and the like.

Additionally, specific examples of the transparent conductive film 2 include conductive metal oxides such as tin oxide doped with antimony or fluorine, zinc oxide doped with aluminum or gallium, indium oxide doped with tin, and the like.

Moreover, a thickness of the transparent conductive film 2 is preferably from about 0.01 to 1.0 μm.

Furthermore, the method for providing the transparent conductive film 2 is not particularly limited, and examples thereof include coating methods, sputtering methods, vacuum deposition methods, spray pyrolysis methods, chemical vapor deposition (CVD) methods, sol-gel methods, and the like.

Next, the oxide semiconductor porous film 3 is obtained by applying a dispersion of oxide semiconductor particles on the transparent conductive film 2.

Specific examples of the oxide semiconductor particles include titanium oxide, tin oxide, zinc oxide, tungstic oxide, zirconium oxide, hafnium oxide, strontium oxide, vanadium oxide, niobium oxide, and the like. One of these may be used alone, or two or more may be used in combination.

The dispersion is obtained by mixing the oxide semiconductor particles and a carrier medium using a disperser such as a sand mill, bead mill, ball mill, three-roll mill, colloid mill, ultrasonic homogenizer, Henschel mixer, jet mill, or the like.

Additionally, the dispersion, after being obtained by mixing using the disperser and immediately prior to use (application), is preferably subjected to ultrasonic treatment using an ultrasonic homogenizer or the like. By performing the ultrasonic treatment immediately prior to use, the photoelectric conversion efficiency of the photoelectric conversion element of the present invention will be better. Reasons for this are thought to be that the filling of the oxide semiconductor porous film, formed using the dispersion that had been subjected to ultrasonic treatment immediately prior to use, with the electrolyte of the present invention is facilitated and the adsorption capacity of the dye is increased.

Furthermore, acetyl acetone, hydrochloric acid, nitric acid, surfactants, chelating agents, and the like may be added to the dispersion in order to prevent the oxide semiconductor particles in the dispersion from re-aggregating; and a polymeric or cellulose thickening agent such as polyethylene oxide, polyvinylalcohol, and the like may be added to increase the viscosity of the dispersion.

Examples of commercially available products that can be used as the dispersion include titanium oxide pastes SP100 and SP200 (both manufactured by Showa Denko K.K.), titanium dioxide fine particle Ti-Nanoxide T (manufactured by Solaronix S.A.), Ti-Nanoxide D (manufactured by Solaronix S.A.), Ti-Nanoxide T/SP (manufactured by Solaronix S.A.), Ti-Nanoxide D/SP (manufactured by Solaronix S.A.), titania coating paste PECC01 (manufactured by Peccell Technologies), titania particle pastes PST-18NR and PST-400C (both manufactured by Nikki Chemical Co., Ltd.), and the like.

A conventional wet film forming method, for example, can be used as the method for applying the dispersion on the transparent conductive film.

Specific examples of the wet film forming method include screen printing methods, ink jet printing methods, roll coating methods, doctor blade methods, spincoating methods, spraying methods, and the like.

Additionally, after applying the dispersion on the transparent conductive film, a heat treatment, chemical treatment, plasma, or ozone treatment is preferably performed in order to enhance electronic contact between the particles, enhance adhesion with the transparent conductive film, and enhance film strength.

A temperature of the heat treatment is preferably from 40° C. to 700° C. and more preferably from 40° C. to 650° C.

Additionally, a duration of the heat treatment is not particularly limited, but is normally from about 10 seconds to 24 hours.

Specific examples of the chemical treatment include chemical plating using a titanium tetrachloride aqueous solution, chemisorption using a carboxylic acid derivative, electrochemical plating using a titanium trichloride aqueous solution, and the like.

<Counterelectrode>

As illustrated in FIG. 1, the counterelectrode is an electrode 5, disposed opposite a photoelectrode 4. For example, a metal plate, or a glass plate or a resin plate having a conductive film on a surface thereof, can be used.

Examples of metals that can be used as the metal plate include platinum, gold, silver, copper, aluminum, indium, titanium, and the like. Examples of resin plates that can be used include, in addition to the plate (film) exemplified by the transparent plate 1 that constitutes the photoelectrode 4, common resin plates that are non-transparent or have limited transparency.

Additionally, examples of the conductive film provided on the surface include conductive metal oxides and the like such as metals such as platinum, gold, silver, copper, aluminum, indium, titanium, and the like; carbon; tin oxide; tin oxides doped with antimony or fluorine; zinc oxide; zinc oxides doped with aluminum or gallium; indium oxides doped with tin; and the like. A thickness and a forming method of the conductive film are the same as for the transparent conductive film 2 that constitutes the photoelectrode 4.

In the present invention, an electrode having a conductive polymeric film formed on a plate or a conductive polymeric film electrode can be used as a counterelectrode 5.

Specific examples of the conductive polymer include polythiophene, polypyrrole, polyaniline, and the like.

Examples of a method for forming the conductive polymeric film on the plate include a method in which a conductive polymeric film from a polymeric dispersion is formed on a plate using a conventionally known wet film forming method such as a dipping method or a spin coating method.

Examples of products that can be used as the conductive polymeric dispersion include a polyaniline dispersion described in Japanese Unexamined Patent Application Publication No. 2006-169291, commercially available products such as a polythiophene derivative aqueous dispersion (Baytron P, manufactured by Bayer), Aquasave (manufactured by Mitsubishi Rayon, polyaniline derivative aqueous solution), and the like.

Additionally, when the plate is the conductive plate, in addition to the method described above, the conductive polymeric film can also be formed on the plate via an electrolysis polymerization method. The conductive polymeric film electrode can use a self-standing film wherein the conductive polymeric film formed on the electrode by the electrolysis polymerization method is peeled from the electrode, or a self-standing film formed using a casting method, a spin coating method, or the like that is conventionally known as a wet film forming method for forming a film from a conductive polymeric dispersion. Here, for convenience, a mixture of a state in which conductive polymeric particles are dispersed throughout the solvent and a state in which conductive polymers are dissolved in the solvent is referred to as the "conductive polymeric dispersion."

<Electrolyte>

As illustrated in FIG. 1, the electrolyte layer is an electrolyte layer 6 that is provided between the photoelectrode 4 and the counterelectrode 5. The electrolyte of the present invention described above is used in the photoelectric conversion element of the present invention.

The photoelectric conversion element of the present invention can achieve superior moisture resistance because the electrolyte of the present invention described above is used.

The dye-sensitized solar cell of the present invention is a type of photoelectric conversion element wherein the photoelectrode constituting the photoelectric conversion element of the present invention described above carries a photosensitized dye.

Here, the photosensitized dye is not particularly limited so long as it is a dye having absorption in the visible light spectrum and/or infrared light spectrum, and a metal complex or an organic dye, or the like, can be used.

Specific examples of the metal complex include ruthenium complex dyes (see the following formula), iron complex dyes, osmium complex dyes, platinum complex dyes, iridium complex dyes, metal phthalocyanine, metal porphyrin, and the like on which a ligand having a bipyridine structure, a terbipyridine structure, or the like is coordinated.

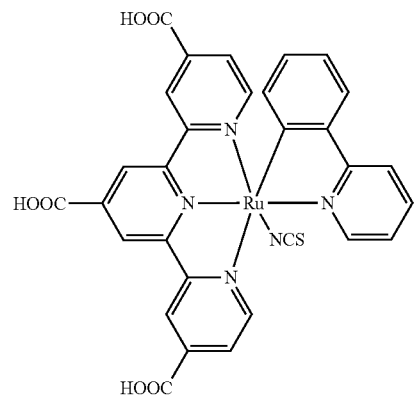

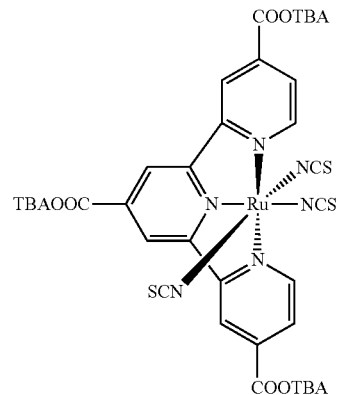

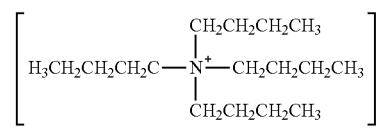

-continued

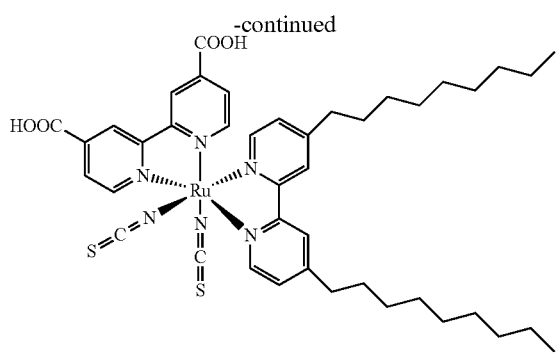

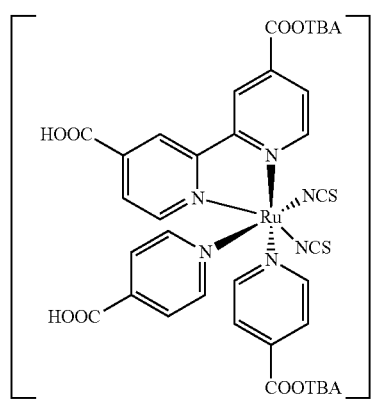

TBA (tetrabuthyl ammonium) =

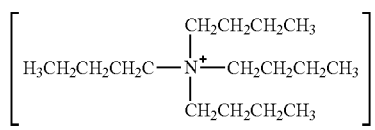

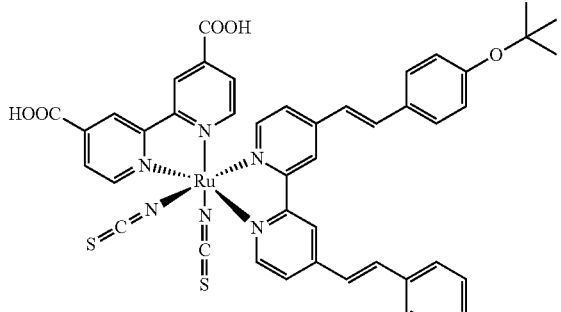

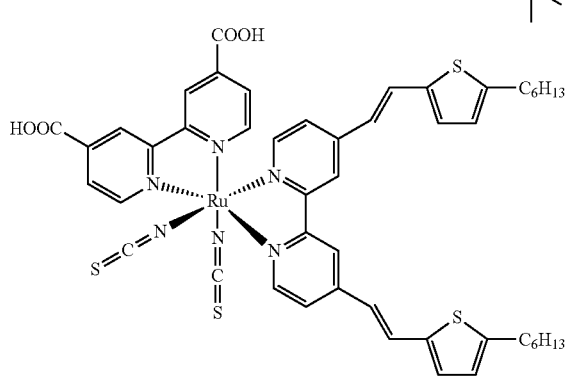

On the other hand, examples of the organic dye include porphyrin-based dyes, phthalocyanine-based dyes, cyanine-based dyes, melocyanine-based dyes, xanthene-based dyes, coumarin-based dyes, indole-based dyes, fluorene-based dyes, triphenylamine-based dyes, and the like.

A method for applying the photosensitized dye is not particularly limited and can be applied by dissolving the dye described above in, for example, water, an alcohol-based solvent, or a nitrile-based solvent, and then immersing the oxide semiconductor porous film 3 in the dye solution or coating the dye solution on the oxide semiconductor porous film 3.

EXAMPLES

The present invention will now be described in greater detail using the following examples, but is in no way restricted to these examples.

Working Examples 1 to 41 and Comparative Examples 1 to 20

Preparation of Electrolyte

An organic solvent, a lamellar clay mineral and the like, shown in Tables 1 to 4 (hereinafter "Table 1, etc.") below, were stirred and mixed in a mixing container according to the composition ratios shown in Table 1, etc. to prepare the electrolyte.

Specifically, according to the composition ratios shown in Table 1, etc., the lamellar clay mineral was added to the organic solvents shown in Table 1, etc. while stirring. Thus, a gel-like substance in which a lamellar clay mineral is pre-expanded and dispersed was obtained.

The organic salt compound, iodine, cobalt complex, and N-methylbenzimidazole shown in Table 1, etc. were stirred and mixed with the obtained gel-like substance according to the composition ratios shown in Table 1, etc.

<Fabrication of the Dye-Sensitized Solar Cell (Photosensitized Dye: Ruthenium Complex Dye 1)>

A titanium oxide paste (Ti-Nanoxide D, manufactured by Solaronix S.A.) was coated on transparent conductive glass (FTO glass, surface resistance: 15 Ω/square, manufactured by Nippon Sheet Glass Co., Ltd.) and dried at room temperature, and thereafter was sintered for 30 minutes at a temperature of 450° C. Thereby, a photoelectrode having a titanium oxide porous film formed on transparent conductive glass was fabricated.

The fabricated photoelectrode was then immersed for four hours in a ruthenium complex dye (cis-(diisothiocyanate)-N, N'-bis(2,2'-bipyridyl-4,4'-dicarboxylic acid)ruthenium(II) complex) (Ruthenium 535-bis TBA, manufactured by Solaronix) butyl alcohol/acetonitrile solution (Specific volume: 1/1; Concentration: $3 \times 10^{-4}$ mol/L).

Thereafter, the product was washed using acetonitrile and dried in a dark location under a stream of nitrogen. Thus, a photoelectrode carrying a photosensitized dye in a titanium oxide electrode of a photoelectrode was used as the photoelectrode.

The prepared electrolyte was applied on the photoelectrode carrying the photosensitized dye, and this and a platinum counterelectrode formed by forming a platinum film having a thickness of about 100 nm on a surface of a transparent conductive glass plate using a sputtering method (indium oxide doped with tin on a conductive face, sheet resistance: 8 Ω/square, manufactured by Nippon Sheet Glass Co., Ltd.) were bonded. When bonding, a thermal fusion bonding film was interposed between the photoelectrode and the platinum counterelectrode. Thermal fusion bonding was performed at 150° C. and a seal was formed between the electrodes. Thus, the dye-sensitized solar cell (photosensitized dye: ruthenium complex dye 1) was obtained.

<Fabrication of the Dye-Sensitized Solar Cell (Photosensitized Dye: Ruthenium Complex Dye 2)>

Other than using cis-(diisothiocyanate)-(2,2'-bipyridyl-4, 4'-dicarboxylate acid)-(2,2'-bipyridyl-4,4'-dinonyl)ruthenium(II) complex (Ruthenium 520-DN, manufactured by Solaronix) as the ruthenium complex dye, a dye-sensitized solar cell (photosensitized dye: ruthenium complex dye 2) was obtained according to the same method described above for the dye-sensitized solar cell (photosensitized dye: ruthenium complex dye 1).

<Fabrication of the Dye-Sensitized Solar Cell (Photosensitized Dye: Organic Dye)>

Other than using an indoline-based dye (D149, manufactured by Mitsubishi Paper Mills Limited) in place of the ruthenium complex dye, a dye-sensitized solar cell (photosensitized dye: organic dye) was fabricated according to the same method used in the fabrication of the dye-sensitized solar cell (photosensitized dye: ruthenium complex dye).

The photoelectric conversion efficiency, heat resistance, moisture resistance, and moist heat resistance of the two obtained types of dye-sensitized solar cells were measured and evaluated according to the methods described below. The results are shown in Table 1, etc.

<Photoelectric Conversion Efficiency>

Figure 2:
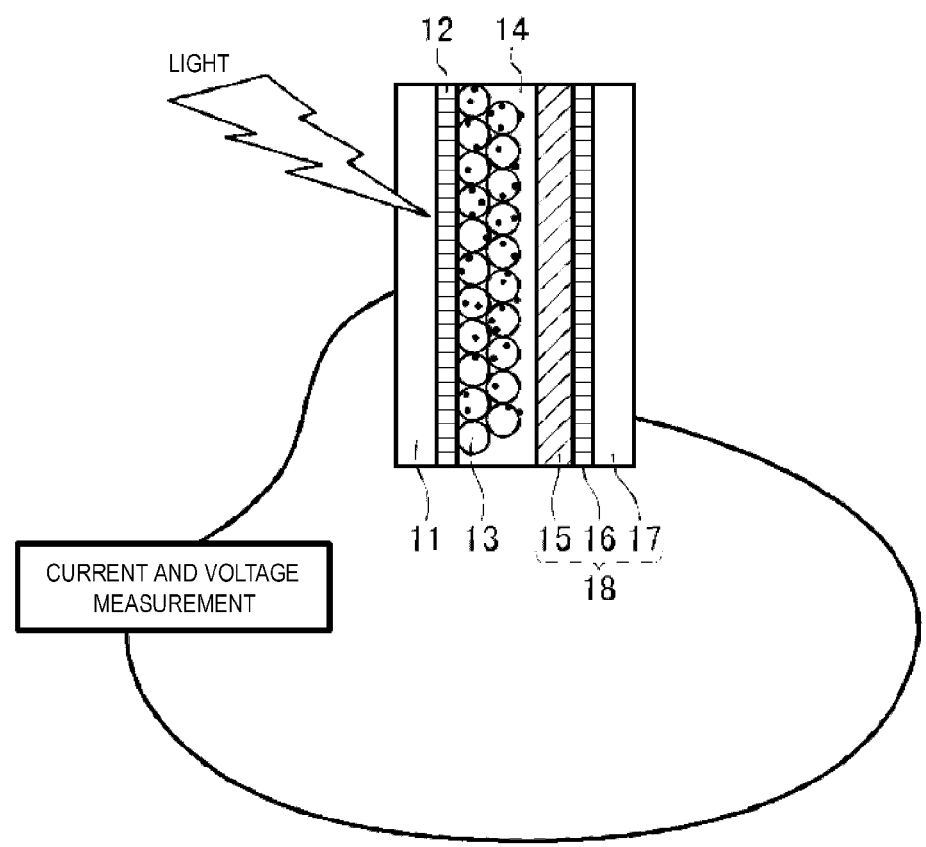

As illustrated in FIG. 2, a solar simulator is used as a light source, the photoelectrode side was irradiated with AM 1.5 artificial sunlight at a light intensity of 100 mW/cm$^2$, and the conversion efficiency was calculated using a current-voltage measuring device (Digital Source Meter 2400, manufactured by Keithley Instruments Inc.).

<Heat Resistance (Maintenance Factor)>

After measurement of photoelectric conversion efficiency, the dye-sensitized solar cell was left for 1,000 hours at 85° C. temperature. Thereafter, photoelectric conversion efficiency was measured by the same method as described above, and the maintenance factor of photoelectric conversion efficiency was calculated (i.e. post-heating photoelectric conversion efficiency/pre-heating photoelectric conversion efficiency).

Heat resistance was evaluated as excellent if the resultant maintenance factor of photoelectric conversion efficiency was 0.80 or greater.

<Moisture Resistance (Maintenance Factor)>

The dye-sensitized solar cell that was measured for photoelectric conversion efficiency was left for 1,000 hours at a temperature of 40° C. and an RH of 85% and, thereafter, was measured again for photoelectric conversion efficiency according to the same method described above. The maintenance factor (post-humidifying photoelectric conversion efficiency/pre-humidifying photoelectric conversion efficiency) was calculated.

When the calculated results of the maintenance factor of photoelectric conversion efficiency was 0.80 or greater, the moisture resistance was evaluated as being superior.

<Moist Heat Resistance (Maintenance Factor)>

The dye-sensitized solar cell that was measured for photoelectric conversion efficiency was left for 1,000 hours at a temperature of 85° C. and an RH of 85% and, thereafter, was measured again for photoelectric conversion efficiency according to the same method described above. The maintenance factor (post-heating and humidifying photoelectric conversion efficiency/pre-heating and humidifying photoelectric conversion efficiency) was calculated.

If the maintenance factor of photoelectric conversion efficiency was 0.80 or greater, the moist heat resistance was evaluated as being excellent.

TABLE 1

Table 1-1: Photosensitized dye: ruthenium complex dye 1

| | Working Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Organic solvent A1 | 100.00 | 100.00 | 100.00 | 100.00 | 100.00 | 100.00 | 100.00 | 100.00 | 100.00 | 100.00 | 100.00 | 100.00 |
| Organic solvent A2 | — | — | — | — | — | — | — | — | — | — | — | — |
| Organic solvent A3 | — | — | — | — | — | — | — | — | — | — | — | — |
| Organic solvent A4 | — | — | — | — | — | — | — | — | — | — | — | — |
| Organic solvent X | — | — | — | — | — | — | — | — | — | — | — | — |
| Organic solvent Y | — | — | — | — | — | — | — | — | — | — | — | — |
| Lamellar clay mineral B1 (indicated as inorganic substance) | 10.00 | 7.00 | — | 10.00 | 10.00 | 7.00 | 7.00 | — | 7.00 | 7.00 | 10.00 | — |
| Lamellar clay mineral B2 (indicated as inorganic substance) | — | 3.00 | 10.00 | — | — | 3.00 | 3.00 | 10.00 | 3.00 | 3.00 | — | — |
| Lamellar clay mineral B3 (indicated as inorganic substance) | — | — | — | — | — | — | — | — | — | — | — | 10.00 |
| Organic salt compound C1 | 30.00 | 30.00 | 30.00 | 30.00 | 30.00 | 30.00 | 30.00 | 30.00 | — | — | 12.00 | 30.00 |
| Organic salt compound C2 | — | — | — | — | — | — | — | — | 25.00 | — | — | — |
| Organic salt compound C3 | — | — | — | — | — | — | — | — | — | 25.00 | — | — |
| Organic salt compound C4 | — | — | — | 12.00 | 6.00 | 12.00 | 6.00 | 12.00 | 12.00 | 12.00 | 12.00 | 12.00 |
| Organic salt compound C5 | — | — | — | — | 6.00 | — | 6.00 | — | — | — | — | — |

TABLE 1-continued

Table 1-1: Photosensitized dye: ruthenium complex dye 1

| | Working Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Organic salt compound C6 | — | — | — | — | — | — | — | — | — | — | 18.00 | — |
| Iodine | 3.50 | 3.50 | 3.50 | 3.50 | 3.50 | 3.50 | 3.50 | 3.50 | 3.50 | 3.50 | 3.50 | 3.50 |
| N-methylbenzimidazole | 6.00 | 6.00 | 6.00 | 6.00 | 6.00 | 6.00 | 6.00 | 6.00 | 6.00 | 6.00 | 6.00 | 6.00 |
| Photoelectric conversion efficiency (%) | 8.8 | 8.5 | 8.5 | 8.6 | 8.6 | 8.4 | 8.4 | 8.4 | 8.5 | 8.5 | 8.4 | 8.2 |
| Heat resistance (maintenance factor) | 0.65 | 0.65 | 0.64 | 0.83 | 0.83 | 0.82 | 0.82 | 0.82 | 0.83 | 0.83 | 0.82 | 0.82 |
| Moisture resistance (maintenance factor) | 0.81 | 0.82 | 0.82 | 0.83 | 0.82 | 0.84 | 0.83 | 0.85 | 0.83 | 0.83 | 0.82 | 0.82 |
| Moist heat resistance (maintenance factor) | 0.54 | 0.55 | 0.56 | 0.82 | 0.81 | 0.83 | 0.82 | 0.84 | 0.82 | 0.82 | 0.81 | 0.82 |

TABLE 2

Table 1-2: Photosensitized dye: ruthenium complex dye 1

| | Working Examples | | | | | | |
|---|---|---|---|---|---|---|---|
| | 13 | 14 | 15 | 16 | 17 | 18 | 19 |
| Organic solvent A1 | — | — | — | — | — | 20.00 | 20.00 |
| Organic solvent A2 | 100.00 | 100.00 | — | — | — | — | — |
| Organic solvent A3 | — | — | 100.00 | 100.00 | — | 80.00 | — |
| Organic solvent A4 | — | — | — | — | 100.00 | — | 80.00 |
| Organic solvent X | — | — | — | — | — | — | — |
| Organic solvent Y | — | — | — | — | — | — | — |
| Lamellar clay mineral B1 (indicated as inorganic substance) | 10.00 | 7.00 | 10.00 | 7.00 | 7.00 | 7.00 | 7.00 |
| Lamellar clay mineral B2 (indicated as inorganic substance) | — | 3.00 | — | 3.00 | 3.00 | 3.00 | 3.00 |
| Lamellar clay mineral B3 (indicated as inorganic substance) | — | — | — | — | — | — | — |
| Organic salt compound C1 | 30.00 | 30.00 | 30.00 | 30.00 | 30.00 | 30.00 | 30.00 |
| Organic salt compound C2 | — | — | — | — | — | — | — |
| Organic salt compound C3 | — | — | — | — | — | — | — |
| Organic salt compound C4 | 12.00 | 12.00 | 12.00 | 12.00 | 12.00 | 12.00 | 12.00 |
| Organic salt compound C5 | — | — | — | — | — | — | — |
| Organic salt compound C6 | — | — | — | — | — | — | — |
| Iodine | 3.50 | 3.50 | 3.50 | 3.50 | 3.50 | 3.50 | 3.50 |
| N-methylbenzimidazole | 6.00 | 6.00 | 6.00 | 6.00 | 6.00 | 6.00 | 6.00 |
| Photoelectric conversion efficiency (%) | 8.3 | 8.2 | 7.8 | 7.7 | 7.3 | 8.1 | 7.6 |
| Heat resistance (maintenance factor) | 0.84 | 0.83 | 0.83 | 0.83 | 0.83 | 0.83 | 0.83 |

TABLE 2-continued

Table 1-2: Photosensitized dye: ruthenium complex dye 1

| | Working Examples | | | | | | |
|---|---|---|---|---|---|---|---|
| | 13 | 14 | 15 | 16 | 17 | 18 | 19 |
| Moisture resistance (maintenance factor) | 0.84 | 0.84 | 0.83 | 0.83 | 0.84 | 0.84 | 0.84 |
| Moist heat resistance (maintenance factor) | 0.83 | 0.83 | 0.83 | 0.83 | 0.83 | 0.83 | 0.83 |

TABLE 3

Table 1-3: Photosensitized dye: ruthenium complex dye 1

| | Comparative Examples | | | | | |
|---|---|---|---|---|---|---|
| | 1 | 2 | 3 | 4 | 5 | 6 |
| Organic solvent A1 | 100.00 | — | — | — | — | — |
| Organic solvent A2 | — | — | — | — | — | — |
| Organic solvent A3 | — | — | — | — | — | — |
| Organic solvent A4 | — | — | — | — | — | — |
| Organic solvent X | — | 100.00 | 100.00 | 100.00 | 100.00 | — |
| Organic solvent Y | — | — | — | — | — | 100.00 |
| Lamellar clay mineral B1 (indicated as inorganic substance) | — | 10.00 | 7.00 | — | — | 7.00 |
| Lamellar clay mineral B2 (indicated as inorganic substance) | — | — | 3.00 | 10.00 | — | 3.00 |
| Lamellar clay mineral B3 (indicated as inorganic substance) | — | — | — | — | 10.00 | — |
| Organic salt compound C1 | 30.00 | 30.00 | 30.00 | 30.00 | 30.00 | 30.00 |
| Organic salt compound C2 | — | — | — | — | — | — |
| Organic salt compound C3 | — | — | — | — | — | — |
| Organic salt compound C4 | — | — | — | — | — | — |
| Organic salt compound C5 | — | — | — | — | — | — |
| Organic salt compound C6 | — | — | — | — | — | — |
| Iodine | 3.50 | 3.50 | 3.50 | 3.50 | 3.50 | 3.50 |
| N-methylbenzimidazole | 6.00 | 6.00 | 6.00 | 6.00 | 6.00 | 6.00 |
| Photoelectric conversion efficiency (%) | 9.2 | 9.6 | 9.5 | 9.5 | 9.4 | 3.5 |
| Heat resistance (maintenance factor) | 0.48 | 0.23 | 0.21 | 0.22 | 0.21 | 0.43 |
| Moisture resistance (maintenance factor) | 0.58 | 0.41 | 0.44 | 0.45 | 0.41 | 0.58 |
| Moist heat resistance (maintenance factor) | 0.38 | 0.18 | 0.17 | 0.18 | 0.17 | 0.48 |

TABLE 4

Table 2: Photosensitized dye: ruthenium complex dye 2

| | Working Examples | | | Comparative Examples | | | |
|---|---|---|---|---|---|---|---|
| | 20 | 21 | 22 | 7 | 8 | 9 | 10 |
| Organic solvent A1 | 100.00 | 100.00 | 100.00 | 100.00 | — | — | — |
| Organic solvent A2 | — | — | — | — | — | — | — |
| Organic solvent A3 | — | — | — | — | — | — | — |
| Organic solvent A4 | — | — | — | — | — | — | — |
| Organic solvent X | — | — | — | — | 100.00 | 100.00 | 100.00 |
| Organic solvent Y | — | — | — | — | — | — | — |
| Lamellar clay mineral B1 (indicated as inorganic substance) | 10.00 | — | — | — | 10.00 | — | — |
| Lamellar clay mineral B2 (indicated as inorganic substance) | — | 10.00 | — | — | — | 10.00 | — |
| Lamellar clay mineral B3 (indicated as inorganic substance) | — | — | 10.00 | — | — | — | 10.00 |
| Organic salt compound C1 | — | — | — | — | — | — | — |
| Organic salt compound C2 | — | — | — | — | — | — | — |
| Organic salt compound C3 | — | — | — | — | — | — | — |
| Organic salt compound C4 | 35.00 | 35.00 | 35.00 | 35.00 | 35.00 | 35.00 | 35.00 |

TABLE 4-continued

Table 2: Photosensitized dye: ruthenium complex dye 2

| | Working Examples | | | Comparative Examples | | | |
|---|---|---|---|---|---|---|---|
| | 20 | 21 | 22 | 7 | 8 | 9 | 10 |
| Organic salt compound C5 | — | — | — | — | — | — | — |
| Organic salt compound C6 | — | — | — | — | — | — | — |
| Iodine | — | — | — | — | — | — | — |
| Cobalt complex | 20.00 | 20.00 | 20.00 | 20.00 | 20.00 | 20.00 | 20.00 |
| N-methylbenzimidazole | 6.00 | 6.00 | 6.00 | 6.00 | 6.00 | 6.00 | 6.00 |
| Photoelectric conversion efficiency (%) | 6.5 | 6.6 | 6.5 | 6.8 | 7.3 | 7.2 | 7.2 |
| Heat resistance (maintenance factor) | 0.82 | 0.82 | 0.82 | 0.45 | 0.21 | 0.22 | 0.21 |
| Moisture resistance (maintenance factor) | 0.82 | 0.85 | 0.82 | 0.56 | 0.38 | 0.43 | 0.37 |
| Moist heat resistance (maintenance factor) | 0.82 | 0.84 | 0.81 | 0.31 | 0.15 | 0.17 | 0.15 |

TABLE 5

Table 3-1: Photosensitized dye: organic dye

| | Working Examples | | | | | | | | | | |
|---|---|---|---|---|---|---|---|---|---|---|---|
| | 23 | 24 | 25 | 26 | 27 | 28 | 29 | 30 | 31 | 32 | 33 |
| Organic solvent A1 | 100.00 | 100.00 | 100.00 | 100.00 | 100.00 | 100.00 | 100.00 | 100.00 | 100.00 | — | — |
| Organic solvent A2 | — | — | — | — | — | — | — | — | — | 100.00 | 100.00 |
| Organic solvent A3 | — | — | — | — | — | — | — | — | — | — | — |
| Organic solvent A4 | — | — | — | — | — | — | — | — | — | — | — |
| Organic solvent X | — | — | — | — | — | — | — | — | — | — | — |
| Organic solvent Y | — | — | — | — | — | — | — | — | — | — | — |
| Lamellar clay mineral B1 (indicated as inorganic substance) | 10.00 | 7.00 | — | 10.00 | 7.00 | — | 7.00 | 7.00 | 10.00 | 10.00 | 7.00 |
| Lamellar clay mineral B2 (indicated as inorganic substance) | — | 3.00 | 10.00 | — | 3.00 | 10.00 | 3.00 | 3.00 | — | — | 3.00 |
| Lamellar clay mineral B3 (indicated as inorganic substance) | — | — | — | — | — | — | — | — | — | — | — |
| Organic salt compound C1 | 30.00 | 30.00 | 30.00 | 30.00 | 30.00 | 30.00 | — | — | 12.00 | 30.00 | 30.00 |
| Organic salt compound C2 | — | — | — | — | — | — | 25.00 | — | — | — | — |
| Organic salt compound C3 | — | — | — | — | — | — | — | 25.00 | — | — | — |
| Organic salt compound C4 | — | — | — | 12.00 | 12.00 | 12.00 | — | — | 12.00 | — | — |
| Organic salt compound C5 | — | — | — | — | — | — | — | — | — | — | — |
| Organic salt compound C6 | — | — | — | — | — | — | — | — | 18.00 | — | — |
| Iodine | 3.50 | 3.50 | 3.50 | 3.50 | 3.50 | 3.50 | 3.50 | 3.50 | 3.50 | 3.50 | 3.50 |
| N-methylbenzimidazole | 6.00 | 6.00 | 6.00 | 6.00 | 6.00 | 6.00 | 6.00 | 6.00 | 6.00 | 6.00 | 6.00 |
| Photoelectric conversion efficiency (%) | 6.1 | 6.0 | 6.0 | 6.1 | 6.1 | 6.0 | 6.2 | 6.2 | 6.1 | 5.8 | 5.8 |
| Heat resistance (maintenance factor) | 0.81 | 0.82 | 0.83 | 0.81 | 0.82 | 0.83 | 0.82 | 0.82 | 0.81 | 0.83 | 0.83 |
| Moisture resistance (maintenance factor) | 0.82 | 0.84 | 0.85 | 0.82 | 0.83 | 0.85 | 0.84 | 0.84 | 0.82 | 0.84 | 0.86 |
| Moist heat resistance (maintenance factor) | 0.81 | 0.82 | 0.83 | 0.81 | 0.82 | 0.83 | 0.82 | 0.82 | 0.81 | 0.82 | 0.83 |

TABLE 6

Table 3-2: Photosensitized dye: organic dye

|  | Working Examples |  |  |  |  | Comparative Examples |  |  |  |  |  |
|---|---|---|---|---|---|---|---|---|---|---|---|
|  | 34 | 35 | 36 | 37 | 38 | 11 | 12 | 13 | 14 | 15 | 16 |
| Organic solvent A1 | — | — | — | 20.00 | 20.00 | 100.00 | — | — | — | — | — |
| Organic solvent A2 | — | — | — | — | — | — | — | — | — | — | — |
| Organic solvent A3 | 100.00 | 100.00 | — | 80.00 | — | — | — | — | — | — | — |
| Organic solvent A4 | — | — | 100.00 | — | 80.00 | — | — | — | — | — | — |
| Organic solvent X | — | — | — | — | — | — | 100.00 | 100.00 | 100.00 | 100.00 | — |
| Organic solvent Y | — | — | — | — | — | — | — | — | — | — | 100.00 |
| Lamellar clay mineral B1 (indicated as inorganic substance) | 10.00 | 7.00 | 7.00 | 7.00 | 7.00 | — | 10.00 | 7.00 | — | — | 7.00 |
| Lamellar clay mineral B2 (indicated as inorganic substance) | — | 3.00 | 3.00 | 3.00 | 3.00 | — | — | 3.00 | 10.00 | — | 3.00 |
| Lamellar clay mineral B3 (indicated as inorganic substance) | — | — | — | — | — | — | — | — | — | 10.00 | — |
| Organic salt compound C1 | 30.00 | 30.00 | 30.00 | 30.00 | 30.00 | 30.00 | 30.00 | 30.00 | 30.00 | 30.00 | 30.00 |
| Organic salt compound C2 | — | — | — | — | — | — | — | — | — | — | — |
| Organic salt compound C3 | — | — | — | — | — | — | — | — | — | — | — |
| Organic salt compound C4 | — | — | — | — | — | — | — | — | — | — | — |
| Organic salt compound C5 | — | — | — | — | — | — | — | — | — | — | — |
| Organic salt compound C6 | — | — | — | — | — | — | — | — | — | — | — |
| Iodine | 3.50 | 3.50 | 3.50 | 3.50 | 3.50 | 3.50 | 3.50 | 3.50 | 3.50 | 3.50 | 3.50 |
| N-methylbenzimidazole | 6.00 | 6.00 | 6.00 | 6.00 | 6.00 | 6.00 | 6.00 | 6.00 | 6.00 | 6.00 | 6.00 |
| Photoelectric conversion efficiency (%) | 5.6 | 5.6 | 5.6 | 5.9 | 5.9 | 6.3 | 6.9 | 6.7 | 6.4 | 6.4 | 2.1 |
| Heat resistance (maintenance factor) | 0.83 | 0.83 | 0.83 | 0.83 | 0.83 | 0.58 | 0.18 | 0.18 | 0.18 | 0.18 | 0.21 |
| Moisture resistance (maintenance factor) | 0.81 | 0.83 | 0.83 | 0.83 | 0.83 | 0.59 | 0.42 | 0.44 | 0.46 | 0.42 | 0.41 |
| Moist heat resistance (maintenance factor) | 0.81 | 0.83 | 0.83 | 0.83 | 0.83 | 0.55 | 0.15 | 0.16 | 0.16 | 0.15 | 0.23 |

TABLE 7

Table 4: Photosensitized dye: organic dye

|  | Working Examples |  |  | Comparative Examples |  |  |  |
|---|---|---|---|---|---|---|---|
|  | 39 | 40 | 41 | 17 | 18 | 19 | 20 |
| Organic solvent A1 | 100.00 | 100.00 | 100.00 | 100.00 | — | — | — |
| Organic solvent A2 | — | — | — | — | — | — | — |
| Organic solvent A3 | — | — | — | — | — | — | — |
| Organic solvent A4 | — | — | — | — | — | — | — |
| Organic solvent X | — | — | — | — | 100.00 | 100.00 | 100.00 |
| Organic solvent Y | — | — | — | — | — | — | — |
| Lamellar clay mineral B1 (indicated as inorganic substance) | 10.00 | — | — | 10.00 | — | — | — |
| Lamellar clay mineral B2 (indicated as inorganic substance) | — | 10.00 | — | — | — | 10.00 | — |
| Lamellar clay mineral B3 (indicated as inorganic substance) | — | — | 10.00 | — | — | — | 10.00 |

TABLE 7-continued

Table 4: Photosensitized dye: organic dye

| | Working Examples | | | Comparative Examples | | | |
|---|---|---|---|---|---|---|---|
| | 39 | 40 | 41 | 17 | 18 | 19 | 20 |
| Organic salt compound C1 | — | — | — | — | — | — | — |
| Organic salt compound C2 | — | — | — | — | — | — | — |
| Organic salt compound C3 | — | — | — | — | — | — | — |
| Organic salt compound C4 | 35.00 | 35.00 | 35.00 | 35.00 | 35.00 | 35.00 | 35.00 |
| Organic salt compound C5 | — | — | — | — | — | — | — |
| Organic salt compound C6 | — | — | — | — | — | — | — |
| Iodine | — | — | — | — | — | — | — |
| Cobalt complex | 20.00 | 20.00 | 20.00 | 20.00 | 20.00 | 20.00 | 20.00 |
| N-methylbenzimidazole | 6.00 | 6.00 | 6.00 | 6.00 | 6.00 | 6.00 | 6.00 |
| Photoelectric conversion efficiency (%) | 5.8 | 5.8 | 5.7 | 6.2 | 6.9 | 6.8 | 6.8 |
| Heat resistance (maintenance factor) | 0.81 | 0.82 | 0.82 | 0.43 | 0.18 | 0.19 | 0.18 |
| Moisture resistance (maintenance factor) | 0.81 | 0.85 | 0.81 | 0.55 | 0.32 | 0.41 | 0.33 |
| Moist heat resistance (maintenance factor) | 0.81 | 0.83 | 0.81 | 0.28 | 0.12 | 0.15 | 0.12 |

The components shown in Table 1, etc. are as follows.

Organic solvent A1: Methoxypropionitrile (boiling point: 166° C., relative dielectric constant: 25).

Organic solvent A2: Butoxypropionitrile (boiling point: 206° C., relative dielectric constant: 20).

Organic solvent A3: Propylene carbonate (boiling point: 240° C., relative dielectric constant: 65).

Organic solvent A4: Ethylisopropylsulfone (boiling point: 250° C., relative dielectric constant: 32).

Organic solvent X: Acetonitrile (boiling point: 82° C., relative dielectric constant: 21).

Organic solvent Y: Quinoline (boiling point: 237° C., relative dielectric constant: 9).

Lamellar clay mineral B1: Synthetic smectite (trade name: Lucentite SPN, manufactured by Co-op Chemical Co., Ltd. (organically modified lamellar clay mineral of organically modified Lucentite SWN (average particle size: 0.02 µm, also manufactured by Co-op Chemical Co., Ltd.)))

Lamellar clay mineral B2: Silane-treated organic bentonite treated with quaternary ammonium and alkyltrialkoxysilane (manufactured by Hojun Yoko K.K.)

Lamellar clay mineral B3: Synthetic mica (trade name: Somasif MPE (organically modified lamellar clay mineral obtained by organically treating Somasif ME (average particle diameter: 5 to 7 µm, manufactured by Co-op Chemical Co., Ltd.), manufactured by Co-op Chemical Co., Ltd.))

Organic salt compound C1: Tetrapropylammonium iodide (manufactured by Tokyo Chemical Industry Co., Ltd.)

Organic salt compound C2: Methylpropylimidazolium iodide (manufactured by Tokyo Chemical Industry Co., Ltd.)

Organic salt compound C3: Dimethylpropylimidazolium iodide (manufactured by Tokyo Chemical Industry Co., Ltd.)

Organic salt compound C4: Tetrapropylammonium thiocyanate (manufactured by Merck)

Organic salt compound C5: Guanidine thiocyanate (manufactured by Sigma-Aldrich Co. LLC.)

Organic salt compound C6: Trihexyltetradecyl-phosphonium bis(trifluoromethylsulfonyl)amide (manufactured by Sigma-Aldrich Co. LLC.)

Cobalt complex: Tris(2,2'-bipyridine)cobalt hexafluorophosphate (manufactured by Sigma-Aldrich Co. LLC.)

It is clear from the results shown in Table 1, etc. that the electrolytes of Comparative Examples 1, 7, 11, and 17 that were prepared without including the lamellar clay mineral (B) displayed low photoelectric conversion efficiency maintenance factors after heating and humidification, and also displayed inferior heat resistance, moisture resistance, and moist heat resistance.

Additionally, it is clear that the electrolytes of Comparative Examples 2 to 6, 8 to 10, 12 to 16, and 18 to 20 that were prepared without including the organic solvent (A) displayed low photoelectric conversion efficiency maintenance factors after heating and humidification, and also displayed inferior heat resistance, moisture resistance, and moist heat resistance.

In contrast, it is clear that the electrolytes of Working Examples 1 to 41 that were prepared using the organic solvent (A) and the lamellar clay mineral (B) each displayed a high photoelectric conversion efficiency maintenance factor after humidification, and also displayed superior moisture resistance.

It was also found that the electrolyes that were prepared using the lamellar clay mineral B2 that contained an alkylsilyl group as the lamellar clay mineral (B) tended to be more superior in terms of moisture resistance.

Furthermore, with regards to the dye-sensitized solar cells in which the ruthenium complex dye 1 or 2 was used as the photosensitized dye, it was found that using the electrolytes of Working Examples 4 to 22 in which the organic salt compounds C4 and C5 that contained a thiocyanate anion as the organic salt compound (C) were blended had an effect of improving the heat resistance and the moist heat resistance. Note that it was found that the heat resistance and the moist heat resistance of the dye-sensitized solar cells in which an organic dye was used as the photosensitized dye were superior regardless of the presence/absence of the organic salt compounds C4 and C5.

Furthermore, it was found that the post-humidifiying photoelectric conversion efficiency maintenance factor was high and the moisture resistance was superior for the dye-sensitized solar cells in which the ruthenium complex dye 2 was used as the photosensitized dye, even in cases where the cobalt complex was used in place of the iodine as the redox couple (Working Examples 20 to 22).

Likewise, it was found that the post-humidifiying photoelectric conversion efficiency maintenance factor was high and the moisture resistance was superior for the dye-sensitized solar cells in which the organic dye was used as the photosensitized dye, even in cases where the cobalt complex was used in place of the iodine (Working Examples 39 to 41).

REFERENCE NUMERALS

1: Transparent plate
2: Transparent conductive film
3: Oxide semiconductor porous film
4: Photoelectrode
5: Counterelectrode
6: Electrolyte layer
11: Transparent plate
12: Transparent conductive film (ITO, FTO)
13: Metal oxide
14: Electrolyte
15: Platinum film
16: Transparent conductive film (ITO, FTO)
17: Plate
18: Counterelectrode

What is claimed is:

1. An electrolyte comprising: an organic solvent (A) and a lamellar clay mineral comprising an alkyl silyl group (B), wherein the organic solvent (A) has a boiling point of 150° C. or higher, and a relative dielectric constant of 20 or higher and including an organic salt compound (C) having a tertiary or quaternary cation and a thiocyanate anion.

2. The electrolyte according to claim 1, wherein the organic salt compound (C) comprises a cation that is expressed by the following Formula (1) or (2):

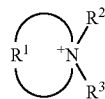

(1)

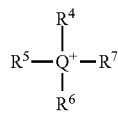

(2)

wherein, in formula (1), $R^1$ is a hydrocarbon group having from 1 to 20 carbons that may contain a hetero atom, and may include a substituent having from 1 to 20 carbons that may contain a hetero atom; $R^2$ and $R^3$ are each independently a hydrogen atom or a hydrocarbon group having from 1 to 20 carbons, and may contain a hetero atom; however, the $R^3$ moiety is absent if the nitrogen atom contains a double bond; in formula (2), Q is a nitrogen, oxygen, phosphorus, or sulfur atom; and $R^4$, $R^5$, $R^6$, and $R^7$ are each independently a hydrogen atom or a hydrocarbon group having from 1 to 8 carbons that may contain a hetero atom; however, the $R^7$ moiety is absent if Q is an oxygen atom or a sulfur atom and, if Q is a sulfur atom, $R^4$ and $R^5$ may be linked.

3. A photoelectric conversion element comprising: a photoelectrode including a transparent conductive film and a metal oxide semiconductor porous film;
a counterelectrode disposed opposite the photoelectrode; and
an electrolyte layer disposed between the photoelectrode and the counterelectrode, wherein the electrolyte layer is an electrolyte for a photoelectric conversion element described in claim 2.

4. A dye-sensitized solar cell comprising the photoelectrode described in claim 3 carrying a photosensitized dye, wherein the moist heat resistance measured after 1000 hours and at a temperature of at least one of 40° C. and 80° C., at a relative humidity of 85% is 0.80 or greater.

5. A photoelectric conversion element comprising: a photoelectrode including a transparent conductive film and a metal oxide semiconductor porous film;
a counterelectrode disposed opposite the photoelectrode; and
an electrolyte layer disposed between the photoelectrode and the counterelectrode, wherein the electrolyte layer is an electrolyte as described in claim 1.

6. A dye-sensitized solar cell comprising the photoelectrode described in claim 5 carrying a photosensitized dye.

7. The photoelectric conversion element according to claim 5, wherein the organic salt compound (C) comprises a cation that is expressed by the following Formula (1) or (2):

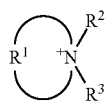

(1)

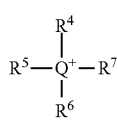

(2)

wherein, in formula (1), R1 is a hydrocarbon group having from 1 to 20 carbons that may contain a hetero atom, and may include a substituent having from 1 to 20 carbons that may contain a hetero atom; R2 and R3 are each independently a hydrogen atom or a hydrocarbon group having from 1 to 20 carbons, and may contain a hetero atom; however, the R3 moiety is absent if the nitrogen atom contains a double bond;
in formula (2), Q is a nitrogen, oxygen, phosphorus, or sulfur atom; and R4, R5, R6, and R7 are each independently a hydrogen atom or a hydrocarbon group having from 1 to 8 carbons that may contain a hetero atom; however, the R7 moiety is absent if Q is an oxygen atom or a sulfur atom and, if Q is a sulfur atom, R4 and R5 may be linked.

8. The photoelectric conversion element according to claim 7 wherein the organic salt compound (C) comprises a cation that is expressed by Formula (1)
wherein, in formula (1), R1 is a hydrocarbon group having from 1 to 20 carbons that may contain a hetero atom, and may include a substituent having from 1 to 20 carbons that may contain a hetero atom; R2 and R3 are each independently a hydrogen atom or a hydrocarbon group having from 1 to 20 carbons, and may contain a hetero atom; however, the R3 moiety is absent if the nitrogen atom contains a double bond.

9. A dye-sensitized solar cell comprising the photoelectrode described in claim 5 carrying a photosensitized dye, wherein the moist heat resistance measured after 1000 hours and at a temperature of at least one of 40° C. and 80° C., at a relative humidity of 85% is 0.80 or greater.

* * * * *